(12) United States Patent
Xing

(10) Patent No.: US 11,811,004 B1
(45) Date of Patent: Nov. 7, 2023

(54) DISPLAY PANEL, DISPLAY DEVICE AND CONTROL METHOD

(71) Applicant: Hubei Yangtze Industrial Innovation Center Of Advanced Display Co., Ltd., Wuhan (CN)

(72) Inventor: Liang Xing, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 0 days.

(21) Appl. No.: 17/949,261

(22) Filed: Sep. 21, 2022

(30) Foreign Application Priority Data

Jun. 30, 2022 (CN) .......................... 202210756889.0

(51) Int. Cl.
*H01L 33/44* (2010.01)
*H01L 33/58* (2010.01)
(Continued)

(52) U.S. Cl.
CPC ............... *H01L 33/44* (2013.01); *G09G 3/32* (2013.01); *H01L 25/167* (2013.01); *H01L 25/18* (2013.01);
(Continued)

(58) Field of Classification Search
CPC ............ G09G 3/32; G09G 2300/0426; G09G 2320/028; G09G 2358/00; H01L 24/08; H01L 24/16; H01L 24/24; H01L 25/18; H01L 33/44; H01L 33/58; H01L 33/62; H01L 2224/05572; H01L 2224/05573; H01L 2224/08145; H01L 2224/16145; H01L 2224/24051; H01L 2224/24105; H01L 2224/24146

See application file for complete search history.

(56) References Cited

U.S. PATENT DOCUMENTS

| 11,138,929 B2 * | 10/2021 | Park ...................... G09G 3/3266 |
| 11,302,745 B2 * | 4/2022 | Yeon ..................... H01L 33/0075 |

(Continued)

FOREIGN PATENT DOCUMENTS

| CN | 105702202 B | 9/2018 |
| CN | 109301047 A | 2/2019 |
| CN | 214226938 U | 9/2021 |

*Primary Examiner* — Vinh T Lam
(74) *Attorney, Agent, or Firm* — East IP P.C.

(57) ABSTRACT

A display panel, a display device, and a control method are provided. The display panel includes: a substrate; a group of light-emitting devices located at a side of the substrate and comprising a first light-emitting device and a second light-emitting device that is disposed at least partially surrounding the first light-emitting device; a driving circuit comprising a first driving circuit for driving the first light-emitting device and a second driving circuit for driving the second light-emitting device; and a shielding part located at a side of the group of light-emitting devices away from the substrate, wherein an orthographic projection of the shielding part on the substrate is at least partially overlapped with an orthographic projection of the second light-emitting device on the substrate. The embodiments of the present application can not only achieve privacy protection, but also improve a display effect of the display device under a front viewing angle.

20 Claims, 10 Drawing Sheets

(51) Int. Cl.
*H01L 25/18* (2023.01)
*G09G 3/32* (2016.01)
*H01L 25/16* (2023.01)
*H01L 33/62* (2010.01)
*H01L 23/00* (2006.01)

(52) U.S. Cl.
CPC ..... *H01L 33/58* (2013.01); *G09G 2300/0426* (2013.01); *G09G 2320/028* (2013.01); *G09G 2358/00* (2013.01); *H01L 24/05* (2013.01); *H01L 24/08* (2013.01); *H01L 24/16* (2013.01); *H01L 24/24* (2013.01); *H01L 33/62* (2013.01); *H01L 2224/05572* (2013.01); *H01L 2224/05573* (2013.01); *H01L 2224/08145* (2013.01); *H01L 2224/16145* (2013.01); *H01L 2224/24051* (2013.01); *H01L 2224/24105* (2013.01); *H01L 2224/24146* (2013.01)

(56) References Cited

U.S. PATENT DOCUMENTS

| | | | | |
|---|---|---|---|---|
| 11,302,762 | B2 * | 4/2022 | Youn | H10K 59/126 |
| 11,347,128 | B2 * | 5/2022 | Tan | G02B 6/0035 |
| 11,367,815 | B2 * | 6/2022 | Han | H01L 29/78633 |
| 11,380,750 | B2 * | 7/2022 | Seo | G09G 3/3275 |
| 11,410,979 | B2 * | 8/2022 | Yajima | H01L 27/156 |
| 11,417,703 | B2 * | 8/2022 | Xu | H01L 33/62 |
| 11,508,795 | B2 * | 11/2022 | Park | G09G 3/3233 |
| 11,515,338 | B2 * | 11/2022 | Lee | H10K 59/131 |
| 11,515,375 | B2 * | 11/2022 | Zhang | H10K 59/126 |
| 11,538,882 | B2 * | 12/2022 | Cho | H10K 59/1213 |
| 11,538,968 | B2 * | 12/2022 | Song | H01L 33/56 |
| 11,550,087 | B2 * | 1/2023 | Park | G09G 3/3607 |
| 11,580,904 | B2 * | 2/2023 | Xu | G09G 3/3216 |
| 11,581,383 | B2 * | 2/2023 | Wang | H10K 59/131 |
| 11,626,552 | B2 * | 4/2023 | Kim | H01L 25/0753 257/79 |
| 11,646,300 | B2 * | 5/2023 | Xu | H01L 24/32 257/89 |
| 11,670,644 | B2 * | 6/2023 | Kim | G09G 3/32 345/205 |
| 2017/0033171 | A1 * | 2/2017 | Kim | G09G 3/3233 |
| 2021/0320130 | A1 * | 10/2021 | Xian | H01L 27/124 |
| 2021/0351258 | A1 * | 11/2021 | Yuan | H04M 1/0266 |
| 2022/0069188 | A1 * | 3/2022 | Akimoto | G09F 9/00 |
| 2022/0077121 | A1 * | 3/2022 | Bae | H01L 33/507 |
| 2022/0084999 | A1 * | 3/2022 | Lee | H01L 33/44 |
| 2022/0123178 | A1 * | 4/2022 | Li | H01L 33/005 |
| 2022/0130810 | A1 * | 4/2022 | Park | H01L 33/507 |
| 2022/0139999 | A1 * | 5/2022 | Yeon | G09G 3/32 257/89 |
| 2022/0157228 | A1 * | 5/2022 | Itou | G09F 9/33 |
| 2022/0199725 | A1 * | 6/2022 | Choi | H01L 25/0753 |
| 2022/0208804 | A1 * | 6/2022 | Jang | H01L 27/1255 |
| 2022/0208863 | A1 * | 6/2022 | Cho | H10K 59/65 |
| 2022/0216291 | A1 * | 7/2022 | Choi | H10K 59/131 |
| 2022/0231082 | A1 * | 7/2022 | Yeon | H01L 25/50 |
| 2022/0254855 | A1 * | 8/2022 | Zhang | H10K 59/122 |
| 2022/0260873 | A1 * | 8/2022 | Moon | G09G 3/3648 |
| 2022/0262827 | A1 * | 8/2022 | Lee | H01L 27/1244 |
| 2022/0293057 | A1 * | 9/2022 | Shang | H10K 59/131 |
| 2022/0320391 | A1 * | 10/2022 | Han | H01L 27/156 |
| 2022/0344379 | A1 * | 10/2022 | Yun | H01L 25/167 |
| 2022/0367772 | A1 * | 11/2022 | Oh | H10K 59/121 |
| 2022/0406867 | A1 * | 12/2022 | Choi | H10K 59/124 |
| 2023/0006112 | A1 * | 1/2023 | Kim | H01L 25/167 |
| 2023/0028604 | A1 * | 1/2023 | Ma | H10K 59/126 |
| 2023/0071577 | A1 * | 3/2023 | Woo | H10K 59/126 |
| 2023/0122457 | A1 * | 4/2023 | Heo | H01L 27/1259 257/91 |
| 2023/0157098 | A1 * | 5/2023 | Wang | G09G 3/3233 345/206 |
| 2023/0178017 | A1 * | 6/2023 | Wang | H10K 59/131 345/55 |

* cited by examiner

DISPLAY PANEL, DISPLAY DEVICE AND CONTROL METHOD

CROSS-REFERENCE TO RELATED APPLICATION

The present application is based upon and claims priority to Chinese Patent Application No. 202210756889.0, filed on Jun. 30, 2022, which is incorporated herein by reference in its entirety.

TECHNICAL FIELD

The present application relates to the technical field of display devices, in particular to a display panel, a display device and a control method.

BACKGROUND

A micro-light-emitting diode (Micro LED) is a device with a size in a range from several microns to several hundreds of microns. Due to its much smaller size than an ordinary LED, it is possible to use such a single LED as a pixel (Pixel) for implementing display. A Micro LED display is a display that employs a high-density array of Micro LEDs as an array of display pixels for implementing image display. With continuous development of related technologies, people's requirements for a display screen, especially in privacy, are getting higher and higher. How to achieve privacy protection has become a technical problem that is needed to be solved urgently.

SUMMARY

In a first aspect of embodiments of the present application, there is provided a display panel, including: a substrate; a group of light-emitting devices located at a side of the substrate and comprising a first light-emitting device and a second light-emitting device that is disposed at least partially surrounding the first light-emitting device; a driving circuit comprising a first driving circuit for driving the first light-emitting device and a second driving circuit for driving the second light-emitting device; and a shielding part located at a side of the group of light-emitting devices away from the substrate, wherein an orthographic projection of the shielding part on the substrate is at least partially overlapped with an orthographic projection of the second light-emitting device on the of the substrate.

In a second aspect of the embodiments of the present application, there is provided a display device including a display panel, wherein the display panel includes: a substrate; a group of light-emitting devices located at a side of the substrate and comprising a first light-emitting device and a second light-emitting device that is disposed at least partially surrounding the first light-emitting device; a driving circuit comprising a first driving circuit for driving the first light-emitting device and a second driving circuit for driving the second light-emitting device; and a shielding part located at a side of the group of light-emitting devices away from the substrate, wherein an orthographic projection of the shielding part on the substrate is at least partially overlapped with an orthographic projection of the second light-emitting device on the of the substrate.

In a third aspect of the embodiments of the present application, there is provided a method for controlling a display panel, the display panel including a substrate; a group of light-emitting devices located at a side of the substrate and comprising a first light-emitting device and a second light-emitting device that is disposed at least partially surrounding the first light-emitting device; a driving circuit comprising a first driving circuit for driving the first light-emitting device and a second driving circuit for driving the second light-emitting device; and a shielding part located at a side of the group of light-emitting devices away from the substrate, wherein an orthographic projection of the shielding part on the substrate is at least partially overlapped with an orthographic projection of the second light-emitting device on the of the substrate, the method includes: acquiring a display mode of the display panel; controlling, by the first driving circuit, the first light-emitting device to operate in a first state according to the display mode; and controlling, by the second driving circuit, the second light-emitting device to operate in a second state according to the display mode.

BRIEF DESCRIPTION OF THE DRAWINGS

Other features, purposes and advantages of the present application will become more apparent by reading the following detailed description of the non-restrictive embodiments with reference to the accompanying drawings, where the same or similar reference signs represent the same or similar features.

Figure 1:
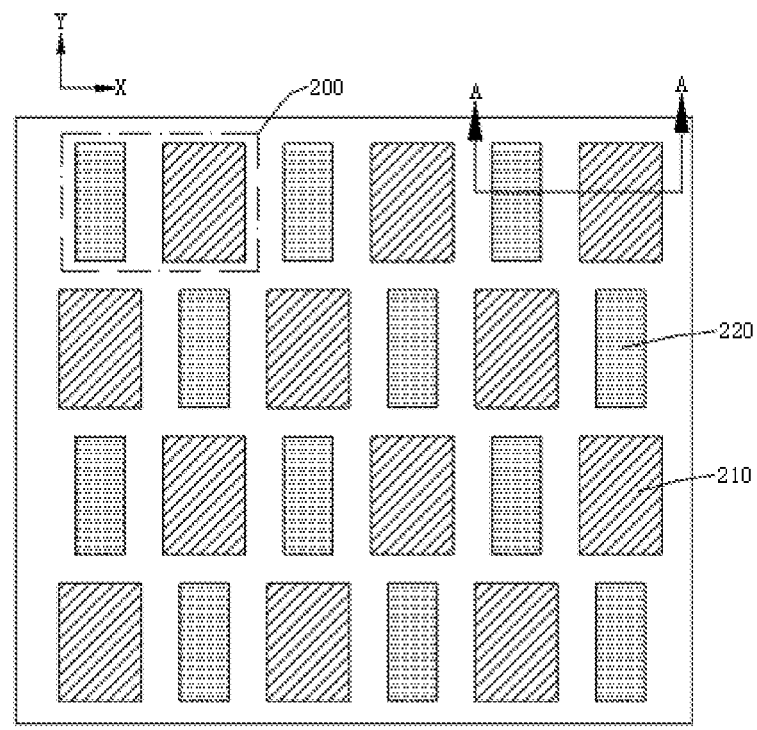
FIG. 1 is a schematic structural diagram of a display panel according to an embodiment of the present application.

DESCRIPTIONS OF REFERENCE SIGNS 100, substrate;
200, a group of light-emitting devices; 210, first light-emitting device; 211, first top surface; 212, first side surface; 213, first bottom surface; 214, reflective layer; 220, second light-emitting device; Q1, first region; Q2, second region; 221, second top surface; 222, second side surface; 223, reflective film; 230, first electrode; 240, second electrode; 250, third electrode; 260, fourth electrode;
300, array layer; 300a, driving circuit; 310, first driving circuit; 320, second driving circuit; 330, first contact electrode; 340, second contact electrode; 350, first substrate electrode; 360, second substrate electrode; 370, first lead; 380, second lead;
400, shielding part; and
500, buffer layer.

DETAILED DESCRIPTION

The features of various aspects and exemplary embodiments of the present application will be described in detail below. In the detailed description below, several specific details are presented in order to provide a comprehensive understanding of the present application. However, for those skilled in the art, it is apparent that the present application may be implemented without some of these specific details. The following description of the embodiments is provided merely for providing a better understanding of the present application by illustrating examples of the present application. In the drawings and the following description, at least a portion of well-known structures and techniques are not shown, in order to avoid unnecessary ambiguity in the present application; and, for clarity, some of the structures may be exaggerated in its dimension. Further, the features, structures, or characteristics described hereinafter may be combined in one or more embodiments in any suitable manner.

In the description of the present application, it should be noted that, unless otherwise indicated, the term "multiple" means two or more; the terms "up", "down", "left", "right", "inside", "outside" and other indications of orientation or a position relationship are provided only for facilitating the description of the present application and simplifying the description, and does not indicate or imply that an involved device or element must have such a specific orientation, structured and operated in such a particular orientation, and therefore should not be construed as a restriction on the present application. In addition, the terms "first", "second", etc. are used only for descriptive purposes and should not be construed as indicating or implying relative importance.

The orientational terms appearing in the following description indicate the orientations shown in the figures and do not limit specific structures of the embodiments of the present application. In the description of the present application, it should also be noted that, unless otherwise expressly specified and indicated, the terms "installation", "connection" should be understood broadly, for example, it may be a fixed connection, may be a detachable connection, or an integrated connection; it may be a direct connection or an indirect connection. For those skilled in the art, specific meaning of the above terms in the present application may be understood on a case-by-case basis.

In order to better understand the present application, the display panel, the display device and the control method according to the embodiments of the present application will be described in detail by reference to FIGS. 1 to 22.

Figure 2:
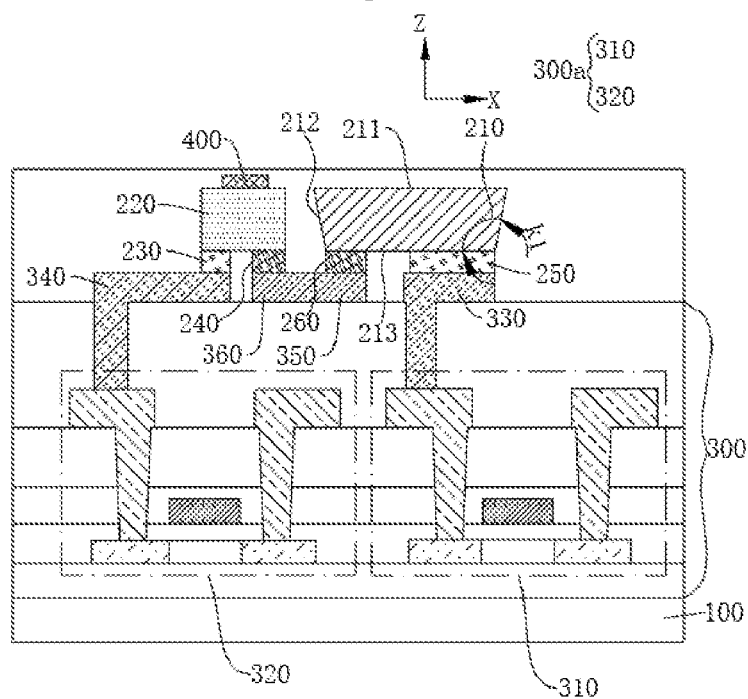
FIG. 2 is a cross-sectional view at A-A in FIG. 1.

FIG. 1 is a schematic local structural view of a display panel according to an embodiment of the present application, and FIG. 2 is a cross-sectional view at A-A in FIG. 1.

As shown in FIGS. 1 and 2, the display panel according to an embodiment of the present application includes a substrate 100 and a group 200 of light-emitting devices disposed on the substrate 100, a driving circuit 300a and a shielding part 400. The group 200 of light-emitting devices is located at a side of the substrate 100, and includes a first light-emitting device 210 and a second light-emitting device 220 that is disposed at least partially surrounding the first light-emitting device 210. The driving circuit 300a includes a first driving circuit 310 for driving the first light-emitting device 210 and a second driving circuit 320 for driving the second light-emitting device 220. The shielding part 400 is located at a side of the group 200 of light-emitting devices 200 away from the substrate 100, and an orthographic projection of the shielding part 400 on the substrate 100 is at least partially overlapped with an orthographic projection of the second light-emitting device 220 on the substrate 100.

In the display panel according to the present embodiment, the display panel includes the substrate 100 and the group 200 of light-emitting devices disposed on the substrate 100, the driving circuit 300a and the shielding part 400. The group 200 of light-emitting devices is provided for implementing display of the display panel, the driving circuit 300a is provided for driving the group 200 of light-emitting devices to emit light, and the shielding part 400 is provided for shielding at least a part of light emitted from the group 200 of light-emitting devices to change a visible angle of the group 200 of light-emitting devices.

The group 200 of light-emitting devices includes the first light-emitting device 210 and the second light-emitting device 220, and the driving circuit 300a includes the first driving circuit 310 for driving the first light-emitting device 210 to emit light and the second driving circuit 320 for driving the second light-emitting device 220 to emit light, so the first light-emitting device 210 and the second light-emitting device 220 can be driven independently by the first driving circuit 310 and the second driving circuit 320 to emit light such that the first light-emitting device 210 and the second light-emitting device 220 can display different image information.

The second light-emitting device 220 is disposed at least partially surrounding to the first light-emitting device 210 such that the first light-emitting device 210 emits light toward its front side, and the second light-emitting device 220 emits light from circumference of the first light-emitting device 210, so the second light-emitting device 220 can affect the display effect of the display panel at a side viewing angle. The first light-emitting device 210 can be used to implement display of the display panel at a front viewing angle, and the second light-emitting device 220 can be used to implement display of the display panel at a side viewing angle. The front viewing angle here refers to a viewing angle within a smaller range of angle of view with respect to a first direction Z which is perpendicular to a plane where the display panel is located. For example, the front viewing angle may be a viewing angle within no more than 30 degree of angle of view with respect to the first direction Z. The side viewing angle refers to a viewing angle within a larger range of angle of view with respect to the first direction Z. For example, the side viewing angle may be a viewing angle within more than 30 degree of angle of view with respect to the first direction Z. When the first light-emitting device 210 and the second light-emitting device 220 display different image information, the second light-emitting device 220 that is located at circumference of the first light-emitting device 210 may display different image information from the first light-emitting device 210. For example, the first light-emitting device 210 is configured to display target image information, while the second light-emitting device 220 is configured to display interference image information, so that the display panel can display the target image information at a front viewing angle, and display the interference image information at a side viewing angle, thereby realizing privacy protection of the display panel. In some other embodiments, the first light-emitting device 210 and the second light-emitting device 220 may be configured to display the same image information, so that an image displayed on the display panel can be observed at different angles.

The shielding part 400 is located at the side of the group 200 of light-emitting devices away from the substrate 100, so the shielding part 400 can shield light outputted from the front of the group 200 of light-emitting devices. The orthographic projection of the shielding part 400 on the substrate 100 is at least partially overlapped with the orthographic projection of the second light-emitting device 220 on the substrate 100, so the shielding part 400 can shield at least a part of light outputted from the front of the second light-emitting device 220, i.e., the shielding part 400 can shield light emitted by the second light-emitting device 220 within a smaller angle with respect to the first direction Z such that visible light emitted from the second light-emitting device 220 has a larger angle with respect to the first direction Z, so as to change an angle at which the second light-emitting device 220 outputs light to reduce a visible angle of the second light-emitting device 220. The shielding part 400 can also reduce an influence of light outputted from the front of the second light-emitting device 220 on the first light-emitting device 210 to improve a display effect of the display panel at a front viewing angle. Thus, the embodiments of the present application can not only achieve privacy protection, but also change an angle at which the second light-emitting device 220 outputs light with help of the shielding part 400 to improve a display effect of the display panel at a front viewing angle.

The substrate 100 may be provided in a variety of ways. For example, the substrate 100 may be a hard substrate, and includes a hard material such as glass. Alternatively, the substrate 100 may be a flexible substrate, and includes a flexible material such as polyimide.

In some embodiments of the present application, the display panel may include an array layer 300 disposed on the substrate 100, and the driving circuit 300a may be disposed at the array layer 300. The array layer 300 may include a driving signal line for transmitting driving information to the driving circuit 300a. The group 200 of light-emitting devices is disposed at a side of the array layer 300 away from the substrate 100.

In some embodiments of the present application, the display panel may further include a first contact electrode 330 via which the first light-emitting device 210 is connected to the first driving circuit 310 and a second contact electrode 340 via which the second light-emitting device 220 is connected to the second driving circuit 320. In some embodiments of the present application, the display panel may further include a first substrate electrode 350 to which a cathode of the first light-emitting device 210 is connected and a second substrate electrode 360 to which a cathode of the second light-emitting device 220 is connected. The first substrate electrode 350 and the second substrate electrode 360 may be provided in a variety of ways. The first substrate electrode 350 and the second substrate electrode 360 may be provided independently and separately with each other. Alternatively, the first substrate electrode 350 and the second substrate electrode 360 may be provided integrally.

There are various ways to set positions of the first substrate electrode 350 and the second substrate electrode 360. As shown in FIG. 2, when each of the first light-emitting device 210 and the second light-emitting device 220 is a horizontal flip LED having two electrodes thereon, which means that the two electrodes of the LED are located at a same side of the LED facing a driving substrate, that is, the electrodes of the first light-emitting device 210 and the electrodes of the second light-emitting device 220 are located at their respective sides facing the substrate 100, the first substrate electrode 350 and the second substrate electrode 360 may be respectively located at a side of the first light-emitting device 210 facing the substrate 100 and a side of the second light-emitting device 220 facing the substrate 100. In this case, the first substrate electrode 350 and the second substrate electrode 360 can be provided in a same layer and prepared in a same process as at least a part of the first contact electrode 330 and the second contact electrode 340.

Figure 3:
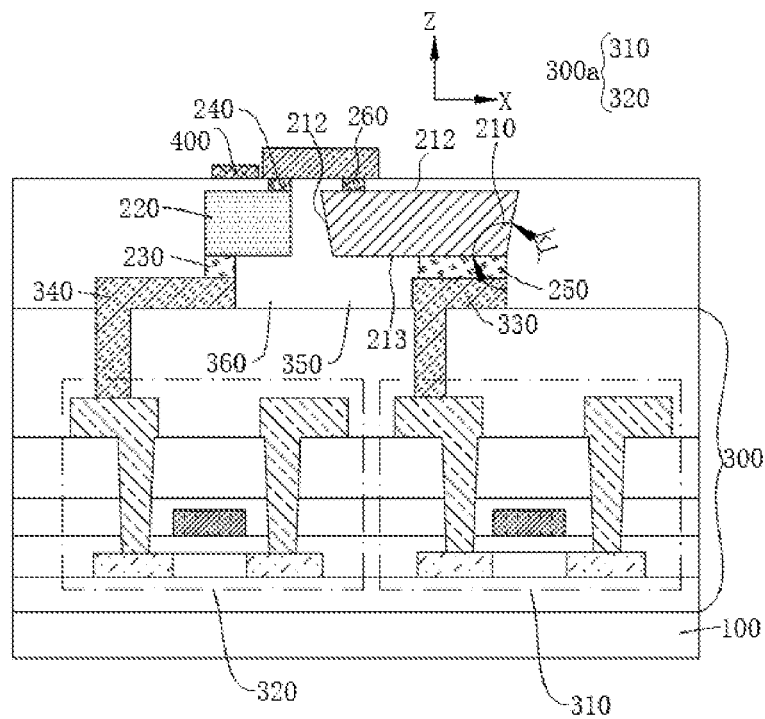
FIG. 3 is another cross-sectional view at A-A in FIG. 1.

Alternatively, as shown in FIG. 3, when each of the first light-emitting device 210 and the second light-emitting device 220 is a vertical LED, which means one of two electrodes of the LED is located at a side of the LED facing a driving substrate, and the other is located at a side away from the driving substrate, the first substrate electrode 350 and the second substrate electrode 360 may be respectively located at a side of the first light-emitting device 210 away from the substrate 100 and a side of the second light-emitting device 220 away from the substrate 100.

There are various ways to provide the group 200 of light-emitting devices. For example, the first light-emitting device 210 and the second light-emitting device 220 are all Micro LEDs, so that the display panel has a better light-emitting effect and a longer service life. There are various ways to set a shape for the first light-emitting device 210 and the second light-emitting device 220. The orthographic projection of first light-emitting device 210 or the second light-emitting device 220 on the substrate 100 may, for example, be a polygon, a circle, an ellipse, a ring and the like. The second light-emitting device 220 may be arranged in a ring surrounding the first light-emitting device 210, and in this case, an orthographic projection of the first light-emitting device 210 on the substrate 100 may be a circle. The first light-emitting device 210 and the second light-emitting device 220 may be arranged in various ways, for example, the first light-emitting device 210 and the second light-emitting device 220 may be arranged in an array along the second direction X and the third direction Y.

There are various ways to provide the shielding part 400 as long as at least a part of the shielding part 400 is located at the side of the second light-emitting device 220 away from the substrate 100. As shown in FIG. 2, the shielding part 400 may be connected in direct contact with the second light-emitting device 220. Alternatively, as shown in FIG. 3, the shielding part 400 may be disposed separately with the second light-emitting device 220, for example, located over a package layer of the second light-emitting device 220.

Figure 4:
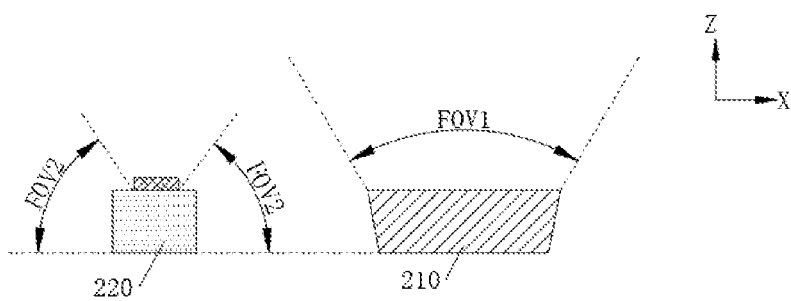
FIG. 4 is an enlarged schematic structural diagram of the first light-emitting device and the second light-emitting device in FIG. 2.

Referring to FIG. 4, FIG. 4 is an enlarged schematic structural diagram of FIG. 2. FIG. 4 merely shows a relative position of the first light-emitting device 210 and the second light-emitting device 220 with respect to a plane where the substrate 100 is located in FIG. 2. In order to better illustrate structures of the first light-emitting device 210 and the second light-emitting device 220, a distance between the first light-emitting device 210 and the second light-emitting device 220 may have been appropriately changed. The scale in FIG. 4 does not constitute a limitation on the structures in the embodiments of the present application.

In some embodiments of the present application, as shown in FIG. 4, the first light-emitting device 210 has a first angle of field of view FOV1, the second light-emitting device 220 has a second angle of field of view FOV2. The first angle of field of view FOV1 is a viewing angle of the first light-emitting device 210, and light emitted by the first light-emitting device 210 is mainly within the first angle of field of view FOV1. Similarly, the second angle of field of view FOV2 is a viewing angle of the second light-emitting device 220, and light emitted by the second light-emitting device 220 is mainly within the second angle of field of view FOV2.

In some embodiments of the present application, a sum of the first angle of field of view FOV1 and a set of second angles of field of view FOV2 is greater than or equal to 180 degree. For example, as shown in FIG. 4, when the first light-emitting device 210 and the second light-emitting device 220 are provided on a one-to-one basis and the second light-emitting device 220 is located at a side of the first light-emitting device 210, a sum of the first angle of field of view FOV1 of the first light-emitting device 210 and the second angles of field of view FOV2 of the second light-emitting device 220 is greater than or equal to 180 degree. In some other embodiments, when the second light-emitting device 220 is in a ring shape and is disposed surrounding the first light-emitting device 210, a sum of the first angle of field of view FOV1 of the first light-emitting device 210 and the second angles of field of view FOV2 of a part of the second light-emitting device 220 that is disposed as the same side as the first light-emitting device 210 is greater than or equal to 180 degree. The second angles of field of view FOV2 of the part of the second light-emitting device 220 that is disposed at the same side as the first light-emitting device 210 is a set of second angels of field of view FOV2. When the first light-emitting device 210 and the second light-emitting device 220 are configured to display the same image information, the image information displayed on the display panel can be viewed at different angles. FIG. 4 illustrate that a sum of the first angle of field of view FOV1 and a set of second angles of field of view FOV2 equals to 180 degree. In other embodiments, for example, when the display panel is a curved display panel and a curved area of the display panel can used for implementing display, a sum of the first angle of field of view FOV1 and the second angles of field of view FOV2 may be greater than 180 degree.

In some embodiments of the present application, as shown in FIG. 4, the first angle of field of view FOV1 may be less than or equals to 60 degree. FIG. 4 may be considered as a cross-sectional view of a display panel on a plane perpendicular to a plane where the substrate 100 is located. The first angle of field of view FOV1 is less than or equals to 60 degree, so when the first light-emitting device 210 is configured to display target image information, the target image information can be observed by a user more clearly within a limited angle. For example, the user can observe the target image information more clearly within 30 degree with respect to the first direction Z, but cannot observe the target image information more clearly in any other angle, which can improve a privacy protection effect of the display panel in a privacy protection mode.

In some embodiments of the present application, an angle between first light emitted by the first light-emitting device 210 and the panel where the substrate 100 is located is greater than or equals to 60 degree. Since the angle between the first light and the plane where the substrate 100 is located is larger, the user can observe the target image information more clearly within a smaller angle with respect to the first direction Z.

In some embodiments of the present application, an angle between second light emitted by the second light-emitting device 220 and the plane where the substrate 100 is located is less than or equals to 60 degree. Since the angle between the second light emitted by the second light-emitting device 220 and the plane where the substrate 100 is located is a smaller angle, so what is observed at a side viewing angle is an image displayed by the second light-emitting device 220. When the second light-emitting device 220 is configured to display interference image information, what is observed on the display panel at a side viewing angle is the interference image information, which ensure the privacy protection effect of the display panel.

Further, since the angle between the second light emitted by the second light emitting device 220 with respect to the first direction Z is a larger angle, it can improve an influence of the second light emitted by the second light-emitting device 220 on the first light emitted by the first light-emitting device 210 to ensure a display effect of the display panel at a front viewing angle.

In some embodiments of the present application, the first angel of field of view FOV1 may not be overlapped with the second angle of field of view angle FOV2 such that light emitted from the first light-emitting device 210 and light emitted from the second light-emitting device 220 will not interfere with each other. In some embodiments of the present application, a sum of the first angle of field of view FOV1 and a set of second angels of field of view FOV2 equals to 180 degree, which avoids that information displayed on the display panel cannot be observed by the user at some viewing angle due to a gap between the first angle of field of view FOV1 and the set of second angles of field of view FOV2.

In some embodiments of the present application, among the set of second angles of field of view FOV2 of the second light-emitting device 220, one of the second angles of field of view FOV2 may be in a range of 0 degree to 60 degree, the other of the second angles of field of view FOV2 may be in a range of 120 degree to 180 degree, so the first angle of field of view FOV1 may be in a range of 60 degree to 120 degree. When the first angle of field of view FOV1 is in a range of 60 degree to 120 degree, an angle between light emitted from the first light-emitting device 210 with respect to the first direction Z is within 30 degree, that is, a viewable angle is in a range of 0 degree to 30 degree. Thus, when an angle between the user's line of sight and the first direction Z is within 30 degree, the user observes image information displayed by the first light-emitting device 210, and when the angle of the user's line of sight with respect to the first direction Z is greater than 30 degree, the user can more clearly observe image information displayed by the second light-emitting device 220. By configuring the first light-emitting device 210 and the second light-emitting device 220 to display different image information, transition among different display modes of the display panel can be achieved.

For example, when the display mode of the display panel is a privacy protection mode, where the first light-emitting device 210 is configured to display target image information, and the second light-emitting device 220 is configured to display interference image information or the second light-emitting device 220 is configured to be turned off, if an angle of the user's line of sight with respective to the first direction Z is within 30 degree, the user observes the target image information displayed by the first light-emitting device 210, and if an angle of the user's line of sight with respect to the first direction Z is greater than 30 degrees, the user can more clearly observes the interference image information or dark state information displayed by the second light-emitting device 220.

When the display mode of the display panel is a normal display mode, where the first light-emitting device 210 and the second light-emitting device 220 are configured to display the same image information, no matter whether an angle of the user's light of sight with respect to the first direction Z is within 30 degree or lager than 30 degree, the user can observe the same image information, and normal display of the display panel can be realized.

In some embodiments of the present application, as shown in FIGS. 2 and 3, the first light-emitting device 210 includes a first top surface 211 located away from the substrate 100, a first bottom surface 213 located facing the substrate 100 and first side surfaces 212 connecting the first top surface 211 and the first bottom surface 213. The first top surface 211 is a light outputting surface, an angle k1 between the first side surfaces 212 and the first bottom surface 213 is an obtuse angle.

In the embodiments, the first top surface 211 is the light outputting surface, i.e., first light emitted by the first light-emitting device 211 is mainly outputted by the first top surface 211, which reduces an angle between light emitted from the first light-emitting device 210 with respect to the first direction Z so as to improves the display effect at a front viewing angle.

Figure 5:
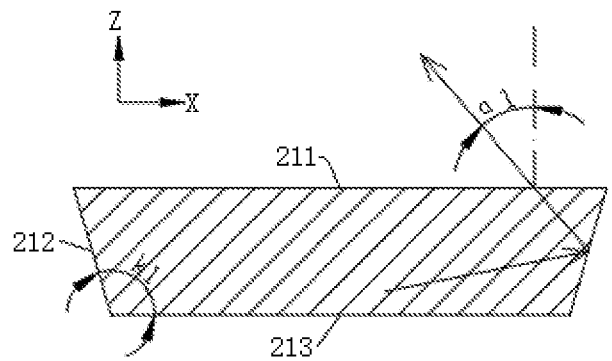
FIG. 5 is a cross-sectional view of a first light-emitting device of a display panel according to an embodiment of the present application.
Figure 6:
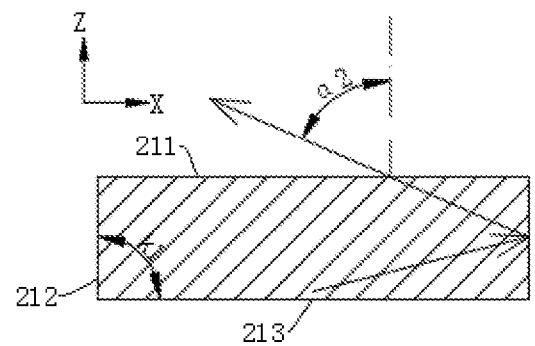
FIG. 6 is a cross-sectional view of a first light-emitting device of another display panel according to an embodiment of the present application.

As shown in FIGS. 5 and 6, when the first light emitted by the first light-emitting device 210 (as shown by the arrows in FIG. 5 and FIG. 6) is reflected by the first side surface 212, an angle α1 of the first light outputted by the first side surface 212 with respect to the first direction Z in a case where the angle k1 between the first side surface 212 and the first bottom surface 213 is an obtuse angle is smaller than that in a case where the angle k1 between the first side surface 212 and the first bottom surface 213 is at a right angle, that is the first light can be deflected towards the top surface 201. Thus, the obtuse angle k1 between the first side surface 212 and the first bottom surface 213 can reduce the angle α1 between the first light emitted by the first light-emitting device 210 and the first direction Z, that is, with increase of the k1, an angle at which light form the first light-emitting device 210 is outputted is reduced, which improves the display effect of the first light-emitting device 210 at a front viewing angle.

Figure 7:
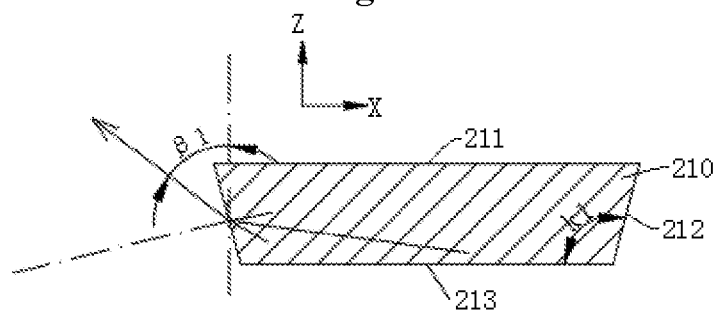
FIG. 7 is a cross-sectional view of a first light-emitting device of another display panel according to an embodiment of the present application.
Figure 8:
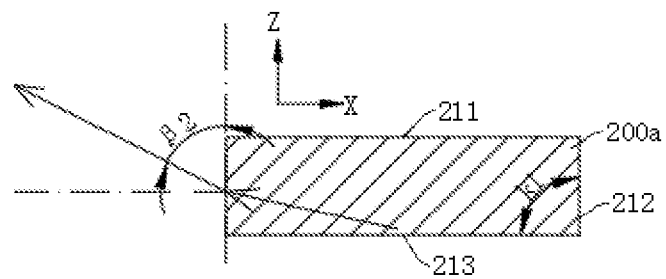
FIG. 8 is a cross-sectional view of a first light-emitting device of another display panel according to an embodiment of the present application.

As shown in FIGS. 7 and 8, when the first light emitted by the first light-emitting device 210 (as shown by the arrows in FIG. 7 and FIG. 8) is outputted by the first side surface 212, the angle α1 of the first light outputted by the first side surface 212 with respect to the first direction Z in a case where the angle k1 between the first side surface 212 and the first bottom surface 213 is an obtuse angle is smaller than that in a case where the angle k1 between the first side surface 212 and the first bottom surface 213 is at a right angle. Thus, amount of light outputted by the light-emitting device 200a can be improved, and thus the display effect of the first light-emitting device 200a at a front viewing angle can be improved.

Thus, as shown in FIGS. 2 to 8, the obtuse angle k1 between the first side surface 212 and the first bottom surface 213 enables the first light emitted by the first light-emitting device 210 to be deflected towards the first direction Z, to reduce the angle between the first light and the first direction Z, so that the display effect of the display panel at a front viewing angle can be improved.

Figure 9:
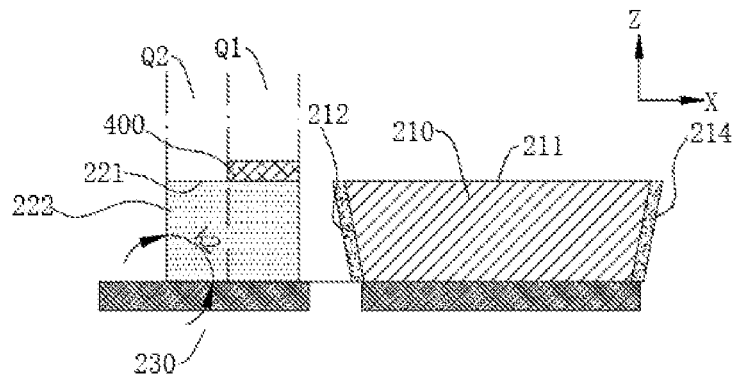
FIG. 9 is another enlarged schematic structural diagram of the first light-emitting device and the second light-emitting device in FIG. 2.

In some embodiments of the present application, referring to FIG. 9, the display panel may further include a reflective layer 214 covering at least a part of the first side surface 212. The first light emitted by the first light-emitting device 210 is reflected by the first side surface 212 back to interior of the first light-emitting device 210 so as to reduce amount of light outputted by the first light-emitting device 210 from the first side surface 212, and in turn reduce amount of light outputted by the first light-emitting device 210 at a side viewing angle, which can further improve the privacy protection effect. Since the first light is reflected by the first side surface 212 back to the first light-emitting device 210, it can also increase amount of light outputted by the first light-emitting device 210 at a front viewing angle, and thus the display effect of the first light-emitting device 210 at the front viewing angle can be improved.

In some embodiments of the present application, the reflective layer 214 may completely cover the first side surface 212 so as to further reduce amount of light outputted from the first side surface 212. The reflective layer 214 can be arranged in various ways. For example, the reflective layer 214 may include a metal material coated on the first side surface 212. Alternatively, the reflective layer 214 may be disposed separately from the first side surface 212, that is, a reflective structure may be additionally provided at outside of the first side surface 212, as long as the reflective layer 214 can cover the first side surface 212 and the first light can be reflected back to the first light-emitting device 210 through the reflective layer 214.

In some embodiments of the present application, at least a part of the first side surface 212 functions as a light blocking surface. When the first side surface 212 functions as a light blocking surface, amount of light outputted from the first side surface 212 can be reduced, and thus amount of light outputted by the first light-emitting device 210 at a side viewing angle can be reduced, which further improves the privacy protection effect.

There are various ways to provide the light-blocking surface. For example, the first side surface 212 may be provided with a light-shielding material or a light-absorbing material. The first light, when passing through the first side surface 212, can be blocked by the light-shielding material, or absorbed by the light-absorbing material, so that the first light cannot be outputted from the first side surface 212. Alternatively, the first side surface 212 may be provided with a reflective material. The first light, when passing through the first side surface 212, can be reflected back to interior of the first light-emitting device 210, and thus cannot be outputted from the first side surface 212.

In some embodiments of the present application, please still refer to FIG. 9, the orthographic projection of the shielding part 400 on the substrate 100 is staggered with an orthographic projection of the first light-emitting device 210 on the substrate 100, that is, the orthographic projection of the shielding part 400 on the substrate 100 is not overlapped with the orthographic projection of the first light-emitting device 210 on the substrate 100, so the shielding part 400 will not shield light outputted from the front of the first light-emitting device 210, which ensures light-outputting effect of the first light-emitting device 210.

In some embodiments of the present application, please still refer to FIG. 9, the orthographic projection of the shielding part 400 on the substrate 100 is smaller than the orthographic projection of the second light-emitting device 220 on the substrate 100, and the second light-emitting device 220 includes a first region Q1 overlapping with the shielding part 400 in the first direction Z, and a second region Q2 not overlapping with the shielding part 400 in the first direction Z, wherein the first region Q1 is located at a side of the second region Q2 close to the first light-emitting device 210.

In the embodiments, the first region Q1 is close to the first light-emitting device 210, so light emitted by the second light-emitting device 220 from the first region Q1 is more likely to have an influence on the first light-emitting device 210. The first area Q1 of the second light-emitting device 220 is shield by the shielding part 400, while the second area Q2 is not shielded by the shielding part 400. Since the shielding part 400 is located in the first region Q1, an influence of light from the second light-emitting device 220 on light outputted from the first light-emitting device 210 can be further reduced.

Figure 10:
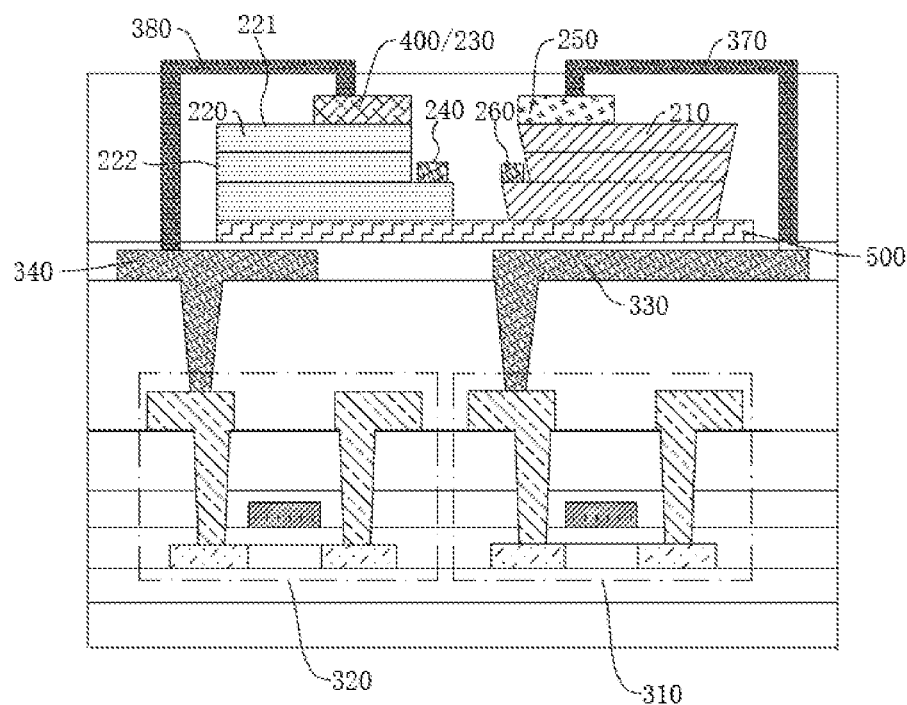
FIG. 10 is another cross-sectional view at A-A in FIG. 1.

In some embodiments of the present application, please refer to FIG. 10, the display panel may further includes a first electrode 230 and a second electrode 240, one of the first electrode 230 and the second electrode 240 is connected to the second driving circuit 320 for driving the second light-emitting device 220 to emit light. That is, the second driving circuit 320 is electrically connected to the second light-emitting device 220 through one of the first electrode 230 and the second electrode 240 to drive the second light-emitting device 220.

One of the first electrode 230 and the second electrode 240 is a cathode, and the other is an anode. For example, the first electrode 230 is an anode and the second electrode 240 is a cathode. The second driving circuit 320 may be connected to the first electrode 230 and drive the second light-emitting device 220 through the first electrode 230 to emit light.

The first electrode 230 and the second electrode 240 generally include conductive materials. For example, the first electrode 230 and the second electrode 240 may be made of metal conductive materials. In this case, the first electrode 230 and the second electrode 240 have a function of shielding or reflecting light.

In some embodiments of the present application, as shown in FIG. 10, at least one of the first electrode 230 and the second electrode 240 is also used as the shielding part 400, which makes the shielding part 400 have an enriched function and simplify the structure of the display panel. For example, in a case where the first electrode 230 is an anode and the second electrode 240 is a cathode, the first electrode 230 can be reused as the shielding part 400. In some other embodiments, in a case where the first electrode 230 and the second electrode 240 are made of metal conductive materials, both the first electrode 230 and the second electrode 240 may be reused as the shielding part 400, and the first electrode 230 and the second electrode 240 may be disposed at a side of the second light-emitting device 220 away from the substrate 100 and insulated from each other.

Figure 11:
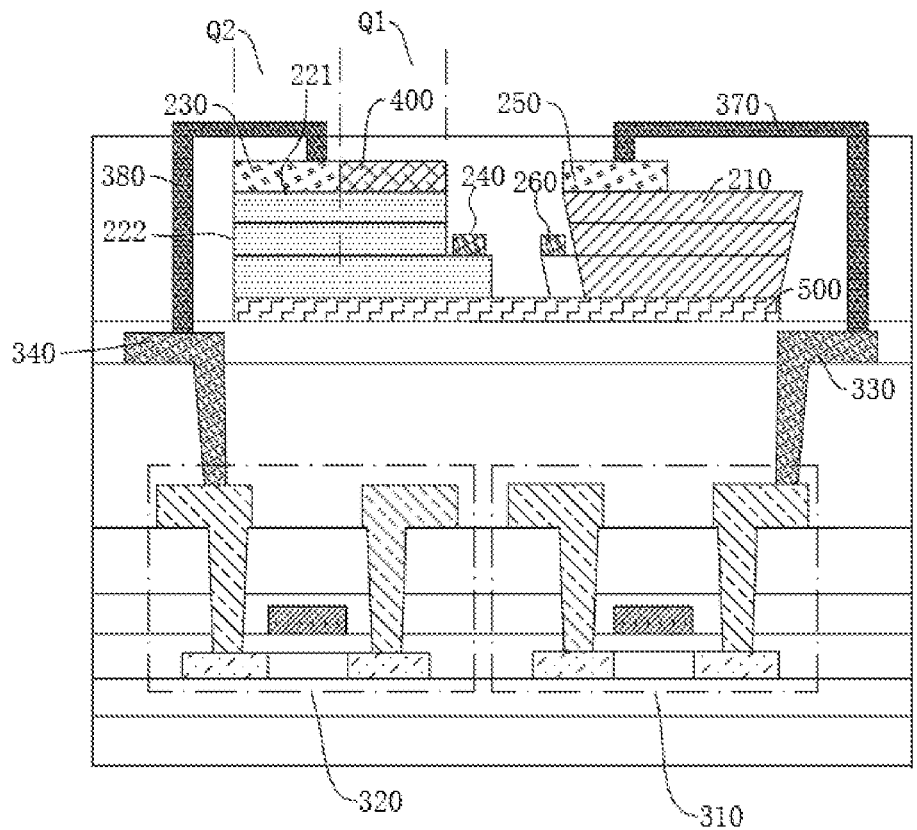
FIG. 11 is another cross-sectional view at A-A in FIG. 1.

In some other embodiments, as shown in FIG. 11, at least one of the first electrode 230 and the second electrode 240 may be disposed side by side with the shielding part 400 at the side of the second light-emitting device 220 away from the substrate 100.

In the embodiments, one of the first electrode 230 and the second electrode 240 is disposed at the side of the second light-emitting device 220 away from the substrate 100 and plays a function of shielding or reflecting light, which can further reduce amount of light outputted from the front of the second light-emitting device 220.

For example, in a case where the first electrode 230 is an anode and the second electrode 240 is a cathode, the first electrode 230 is arranged side by side with the shielding portion 400 at the side of the second light-emitting device 220 away from the substrate 100.

Please still refer to FIG. 10 and FIG. 11, the first light-emitting device 210 and the second light-emitting device 210 are horizontally front-mounted LEDs, and the first light-emitting device 210 includes a third electrode 250 and a fourth electrode 260. One of the third electrode 250 and the fourth electrode 260 is an anode and is connected to the first driving circuit 310, and the other is a cathode. The present application is described by taking the third electrode 250 being an anode and the fourth electrode 260 being a cathode as an example.

In the case where the first light-emitting device 210 is a horizontally front-mounted LED, the third electrode 250 and the fourth electrode 260 are located at the side of the first light-emitting device 210 away from the substrate 100. The third electrode 250 is connected with the first driving circuit 310 through a first lead 370. Likewise, the first electrode 230 is connected to the second driving circuit 320 through a second lead 380.

In some embodiments of the present application, as shown in FIG. 10 and FIG. 11, the second electrode 240 and the fourth electrode 260 may be located on opposite sides of the first light-emitting device 210 and the second light-emitting device 220, so as to reduce an electrode between the second electrode 240 and the fourth electrode 260. The second electrode 240 and the fourth electrode 260 may be connected to a same substrate electrode.

Figure 12:
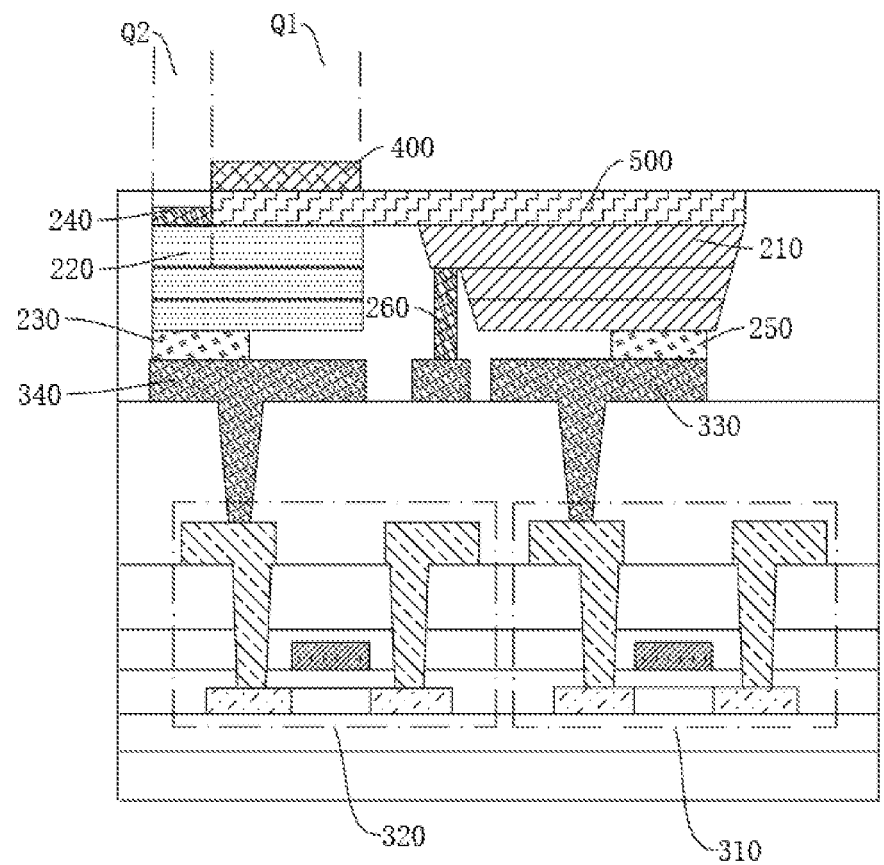
FIG. 12 is another cross-sectional view at A-A in FIG. 1.

In some embodiments of the present application, please still refer to FIG. 11, the second light-emitting device 220 is a horizontally front-mounted LED, and at least one of the first electrode 230 and the second electrode 240 is disposed at the side of the second light-emitting device 220 away from the substrate 100 and side by side with the shielding part 400. When the second light-emitting device 220 includes the first region Q1 and the second region Q2, the first electrode 230 and/or the second electrode 240 is located in the second region Q2. As shown in FIG. 11, the first electrode 230 is disposed side by side with the shielding part 400, and is located in the first region Q1. Alternatively, as shown in FIG. 12, the second light-emitting device 220 is a vertical LED, the second electrode 240 is located at a side of the second light-emitting device 220 away from the substrate 100, and the first electrode 230 is located at a side of the second light-emitting device 220 facing the substrate 100 and is connected to the second contact electrode 340. The second electrode 240 is located in the second region Q2, and the shielding part 400 is located in the first region Q1.

In some embodiments of the present application, as shown in FIGS. 10 and 12, the second light-emitting device 220 includes a second top surface 221 away from the substrate 100, and the shielding portion 400 is in contact and connected with the second top surface 221 of the second light-emitting device 220. In a direction from the second light-emitting device 220 to the first light-emitting device 210, a sum of a width of the first electrode 230 and/or the second electrode 240 that is disposed side by side with the shielding part 400 and a width of the shielding part 400 equals to a width of the second top surface 221.

For example, as shown in FIG. 11, when both the first electrode 230 and the shielding portion 400 are located on the second top surface 221, a sum of the width of the first electrode 230 and the width of the shielding part 400 equals to the width of the second top surface 221, so the second top surface 221 can be completely shield by the first electrode 230 and the shielding part 400, which can further reduce amount of light outputted from the second top surface 221 and reduce an influence of light outputted from the second light-emitting device 220 on light outputted from the first light-emitting device 210.

In some other embodiments of the present application, as shown in FIG. 12, when both the second electrode 240 and the shielding part 400 are located over the second top surface 221, the sum of the width of the second electrode 240 and the width of the shielding part 400 equals to the width of the second top surface 221, that is, the second top surface 221 can be completely shielded by the second electrode 240 and the shielding part 400. In still some other embodiments, the first electrode 230, the second electrode 240 and the shielding part 400 are all located over the second top surface 221, and the sum of the width of the first electrode 230, the width of the second electrode 240 and the width of the shielding part 400 equals to the width of the second top surface 221, that is, the second top surface 221 can be completely shielded by the first electrode 230, the second electrode 240 and the shielding part 400.

In some embodiments of the present application, the second light-emitting device 220 includes a first semiconductor part, a light-emitting part, and a second semiconductor part that are stacked in the order in a direction away from the substrate 100, and the shielding part 400 is located at a side of the second semiconductor part away from the light-emitting part, which can prevent the shielding part 400 from affecting normal light emission of the second light-emitting device 220.

One of the first semiconductor part and the second semiconductor part is connected with the first electrode 230, and the other is connected with the second electrode 240, so that the first electrode 230 and the second electrode 240 can drive the light-emitting part to emit light through the first semiconductor part and the second semiconductor part.

In some embodiments of the present application, as shown in FIG. 12, one of the first electrode 230 and the second electrode 240 is disposed side by side with the shielding part 400 on the second top surface 221, and the other is disposed at a side of the second light-emitting device 220 away from the second top surface 221. For example, as described above, the first electrode 230 is an anode, and the first electrode 230 is located at the side of the second light-emitting device 220 away from the second top surface 221, that is, the first electrode 230 is located at a side of the second light-emitting device 220 facing the array layer 300, so as to reduce a distance between the first electrode 230 and the second driving circuit 320. The second electrode 240 is located on the second top surface 221 so as to further reduce amount of light outputted from the second top surface 221.

In some embodiments of the present application, as shown in FIGS. 10 to 12, as described above, the display panel may further includes the third electrode 250 and the fourth electrode 260, at least one of the third electrode 250 and the fourth electrode 260 is connected to the first driving circuit 310 for driving the first light-emitting device 210 to emit light.

There are various ways to provide the third electrode 250 and the fourth electrode 260. For example, as shown in FIG. 10, the first light-emitting device 210 is a horizontally front-mounted LED, that is, the third electrode 250 and the fourth electrode 260 are located at a side of the first light-emitting device 210 away from the array layer 300.

Alternatively, as shown in FIG. 12, the first light-emitting device 210 is a horizontally flip LED, that is, the third electrode 250 and the fourth electrode 260 are located at a side of the first light-emitting device 210 facing the array layer 300.

In the embodiments, the first driving circuit 310 drives the first light-emitting device 210 through one of the third electrode 250 and the fourth electrode 260, both of which are located at a side of the first light-emitting device 210 facing the substrate 100, which can reduce an influence of the third electrode 250 and the fourth electrode 260 on light outputted from the first light-emitting device 210. That is, the first light-emitting device 210 is a horizontally flip LED, where the first light-emitting device 210 mainly emits light from its front side to ensure light outputting effect of the first light-emitting device 210 at a front viewing angle.

One of the third electrode 250 and the fourth electrode 260 is an anode and the other is a cathode. For example, the third electrode 250 is an anode and is connected to the first driving circuit 310, and the fourth electrode 260 is a cathode.

Figure 13:
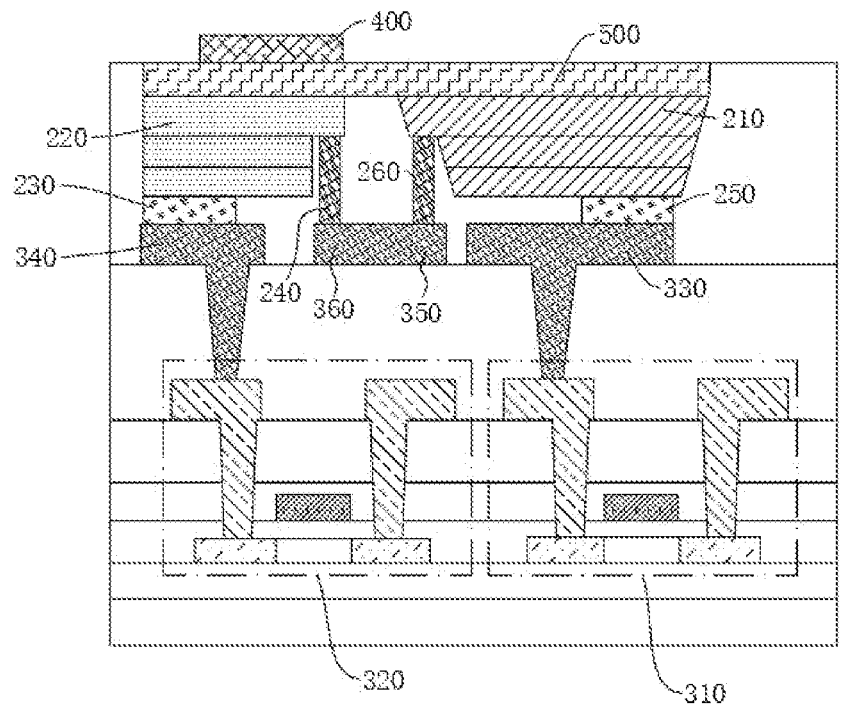
FIG. 13 is another cross-sectional view at A-A in FIG. 1.

In some other embodiments of the present application, as shown in FIG. 13, each of the first light-emitting device 210 and the second light-emitting device 220 is a horizontal flip LED. The third electrode 250 and the fourth electrode 260 of the first light-emitting device 210 are located at its side facing the substrate 100, and the first electrode 210 and the second electrode 220 of the second light-emitting device 220 are also located at its side facing the substrate 100. In some embodiments of the present application, the first electrode 230 is connected to a second contact electrode 340, and the third electrode 250 is connected a first contact electrode 330. The second electrode 240 and the fourth electrode 260 are disposed opposite to each other, so that the second electrode 240 and the fourth electrode 260 can be connected to a first substrate electrode 350 and a second substrate electrode 360 that are formed integrally.

The shielding part 400 can be provided in various ways. The shielding part 400 may be made of a light-shielding material, for example, the shielding part 400 may be made of ink or any other light-shielding material, so that the shielding part 400 can shield light emitted by the second light-emitting device 220. Alternatively, the shielding part 400 may include a reflective material, for example, the shielding part 400 may include a metal material, so that the shielding part 400 can not only shield light emitted from the second light-emitting device 220, but also reflect light emitted from the second light-emitting device 220 back to interior of the second light-emitting device 220, so as improve light outputted from the second light-emitting device 220 in other directions. In still some other embodiments of the present application, the shielding part 400 may be a distributed Bragg reflector (DBR) and is configured to reflect light emitted by the second light-emitting device 220, so that the shielding part 400 can better reflect light emitted by the second light-emitting device 220.

Figure 14:
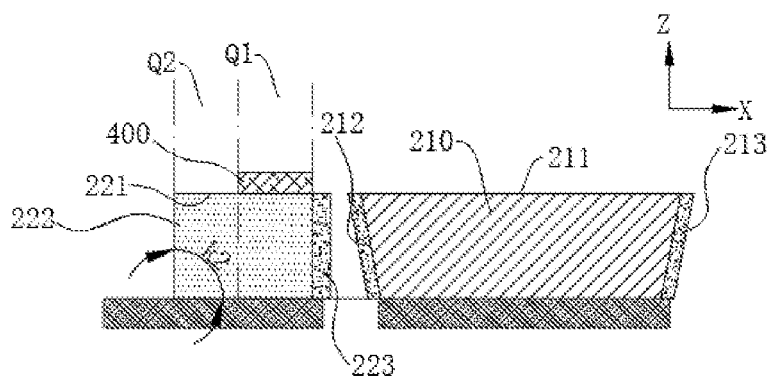
FIG. 14 is another enlarged schematic structural diagram of the first light-emitting device and the second light-emitting device in FIG. 2.

In some embodiments of the present application, as shown in FIG. 14, the second light-emitting device 220 may further includes a second top surface 221 located away from the substrate 100, and a second side surface 222 that is connected to the second top surface 221 and extends from the second top surface 221 towards the substrate 100. At least a part of the second side surface 222 functions as a light outputting surface.

In the embodiments, at least a part of the second side surface 222 of the second light-emitting device 220 functions as a light outputting surface, that is, light emitted by the second light-emitting device 220 is at least partially outputted from the second side surface 222, which can increase an angle of the second light emitted by the second light-emitting device 220 with respect to the first direction Z, and thus not only improve an influence of light emitted by the second light-emitting device 220 on the first light-emitting device 210, but also enable the second light-emitting device 220 to output light from a side of the display panel.

When the display panel is in the privacy protection mode, as described above, the first light-emitting device 210 may display target image information, while the second light-emitting device 220 may display interference image information. The target image information is light outputted from the front of the display panel, so the user can observe the target image information more clearly at the front side. The interference image information is light outputted from a side of the display panel, so what is observed when the user is viewing from the side of the display panel is the interference image information. Thus, the privacy protection function can be realized.

In some embodiments of the present application, as shown in FIG. 14, the second light-emitting device 220 may further include a reflective film 223 disposed at a surface of the second light-emitting device 220 facing the first light-emitting device 210. On one hand, the reflective film 223 can reduce amount of light emitted by the second light-emitting device 220 toward the first light-emitting device 210, to reduce the influence of the second light-emitting device 220 on light emitted from the first light-emitting device 210 On the other hand, the reflective film 223 can reflect light emitted from the side of the first light-emitting device 210 and may even reflect the light back into the first light-emitting device 210, to improve light outputting effect of the front of the first light-emitting device 210 while reducing the viewable angle of the first light-emitting device 210.

In some embodiments of the present application, as shown in FIG. 14, an angle k2 between at least a part of the second side surface 222 and the plane where the substrate 100 is located is in a range of 85 degree to 95 degrees.

According to analysis of light-emitting principle of the first light-emitting device 210 in FIGS. 5 to 8, it can be determined that when the angle k2 between the second side surface 222 and the plane where the substrate 100 is located as shown in FIG. 14 is close to 90 degree, if the second light emitted from the second light-emitting device 220 can be outputted from the second side surface 222, the second light emitted by the second light-emitting device 220 to the second side surface 222 can be outputted from a larger angle, which can increase an angle of the second light emitted by the second light-emitting device 220 with respect to the first direction Z, to further improve amount of light outputted from the second light-emitting device 220 and improve the privacy protection effect of the second light-emitting device 220. If the second light is reflected from the second side surface 222 and is outputted from the second top surface 221, an angle of light outputted from the second top surface 221 after reflected by the second side surface 222 with respect to the first direction Z is larger when the angle between the second side surface 222 and the plane where the substrate 100 is located is close to 90 degree, so light emitted from the second light-emitting device 220 is more divergent, and thus privacy protection can be better achieved.

There are various ways to set the relative positional relationship between the second light-emitting device 220 and the first light-emitting device 210. As shown in FIG. 1, for example, the second light-emitting device 220 may be located at a side of the first light-emitting device 210 in the second direction X and/or the third direction Y. Alternatively, two second light-emitting devices 220 are respectively disposed at both sides of the first light-emitting device 210 in the second direction X and/or the third direction Y. Alternatively, two or more second light-emitting devices 220 may be arranged at intervals at circumference of the first light-emitting device 210.

Figure 15:
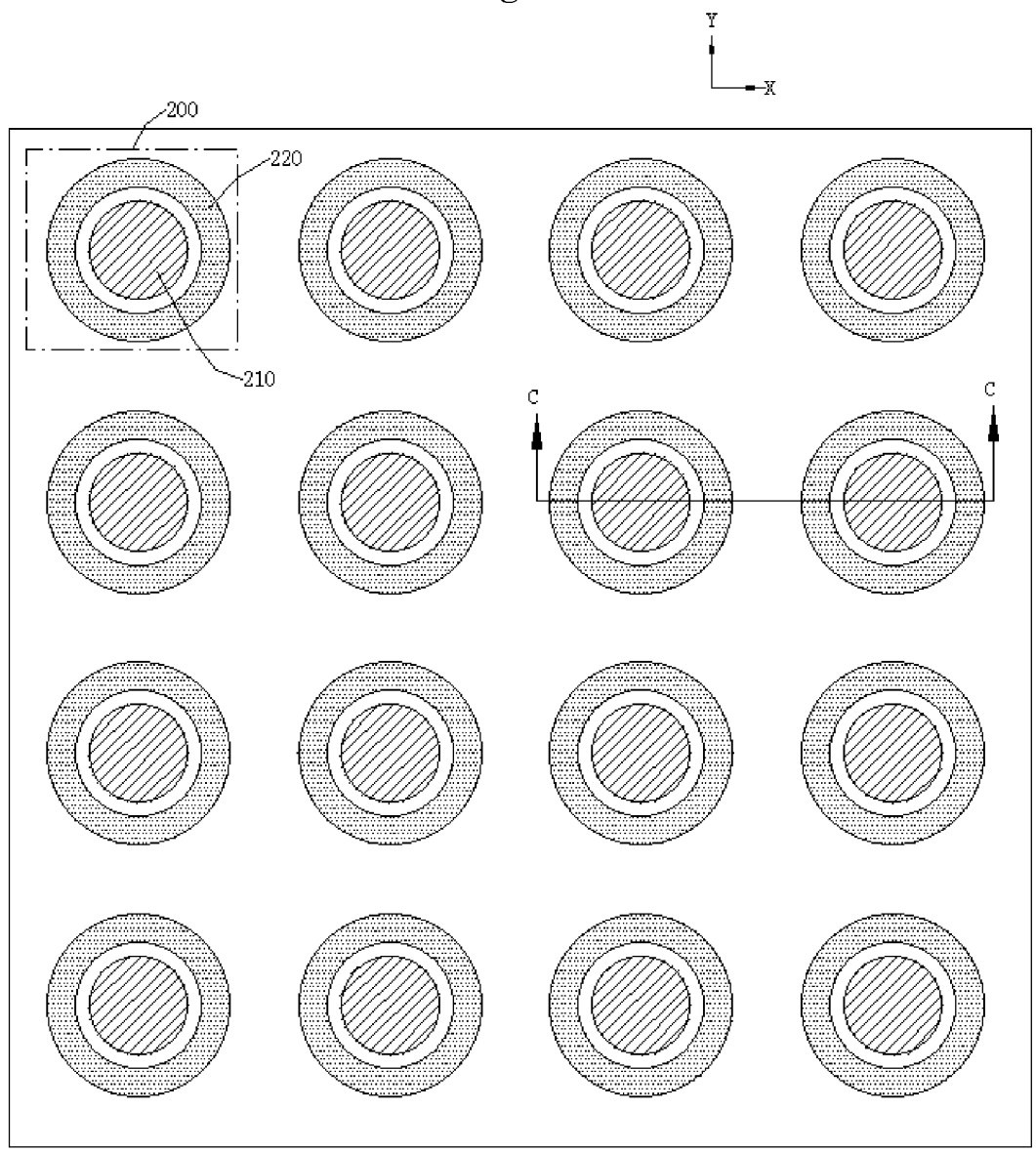
FIG. 15 is a schematic structural diagram of another display panel according to an embodiment of the present application.
Figure 16:
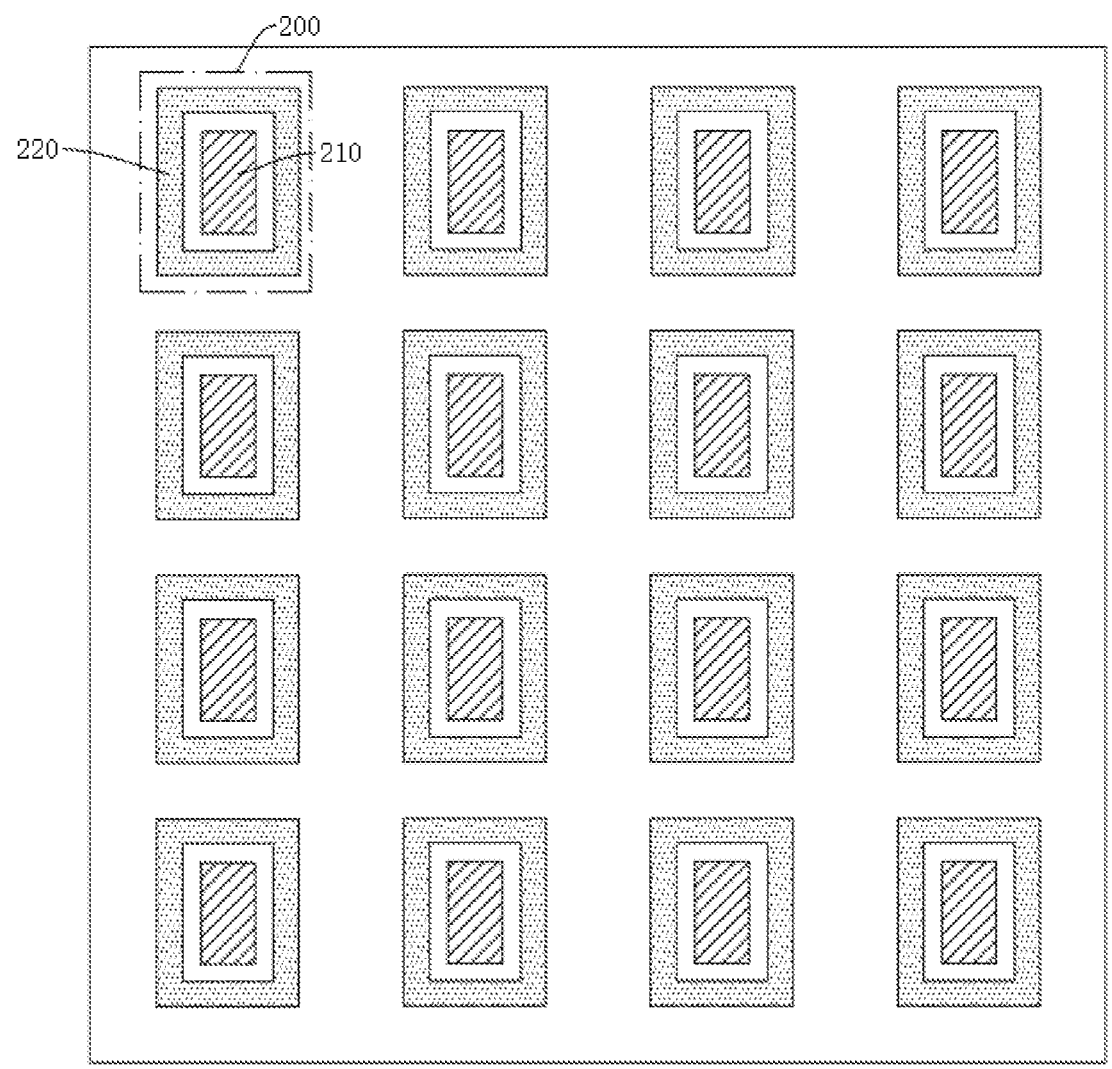
FIG. 16 is a schematic structural diagram of another display panel according to an embodiment of the present application.

In some other embodiments of the present application, as shown in FIG. 15 and FIG. 16, the second light-emitting device 220 may be disposed surrounding the first light-emitting device 210 in a closed ring, so the second light-emitting device 220 can emit interfering light at different positions at circumference of the first light-emitting device 210, which can further improve the privacy protection effect.

The shapes of the first light-emitting device 210 and the second light-emitting device 220 can be set in various ways. For example, as shown in FIG. 15, the orthographic projection of the first light-emitting device 210 along the first direction may be a circle, and the second light-emitting device 220 along the first direction may be a ring. Alternatively, as shown in FIG. 16, the orthographic projection of the first light-emitting device 210 along the first direction may be a polygon (e.g., a rectangle), and the orthographic projection of the second light-emitting device 220 along the first direction may be a polygonal ring.

Figure 17:
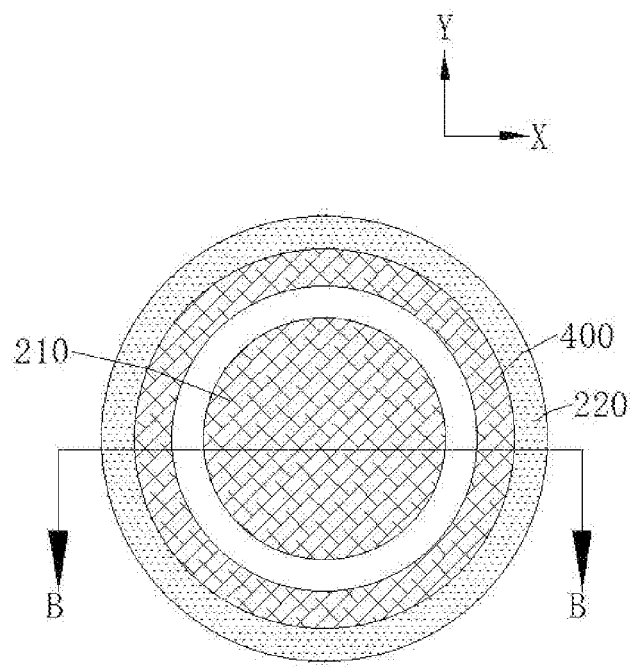
FIG. 17 is a schematic structural diagram of a group of light-emitting devices of a display panel according to an embodiment of the present application.

In a case where the shape of second light-emitting device 220 is a closed ring, as shown in FIG. 17, the shielding part 400 is arranged in a closed ring surrounding the first light-emitting device 210, so that the shielding part 400 can shield the second light-emitting devices 220 at different directions of the first light-emitting device 210 in the group 200 of the light-emitting devices.

In some embodiments of the present application, as shown in FIG. 17, the shape of the second light-emitting device 220 is a closed ring, a distance between an edge of an orthographic projection of the first light-emitting device 210 on the substrate 100 and an edge of an orthographic projection of the second light-emitting device 220 on the substrate 100 is equally set, to makes brightness of the second light-emitting device 220 at different positions of circumference of the first light-emitting device 210 consistent, and thus make the display effect of the display panel at the side viewing angles more uniform.

In some embodiments of the present application, as shown in FIG. 17, a distance of an edge of an orthographic projection of the shielding part 400 on the substrate 100 from an edge of an orthographic projection of the first light-emitting device 210 on the substrate 100 is isometrically set, to make shielding effects of the shielding part 400 at different positions of the circumference of the first light-emitting device 210 on the second light-emitting device 220 consistent, and thus make the display effect of the display panel at the side viewing angles more uniform.

Figure 18:
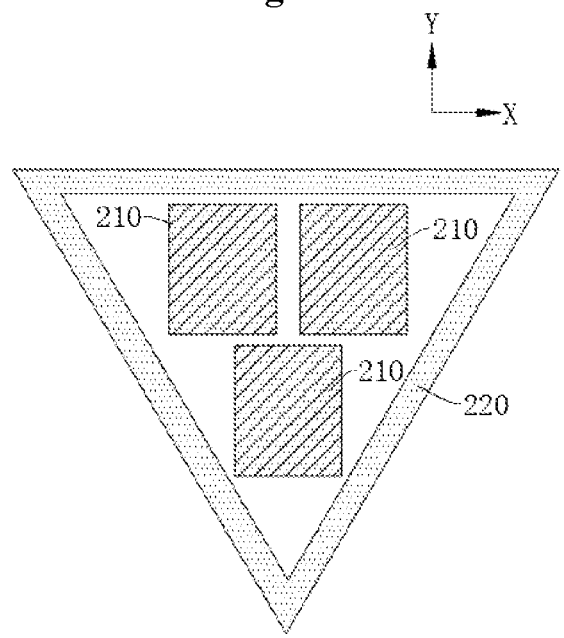
FIG. 18 is another schematic structural diagram of a group of light-emitting devices of a display panel according to an embodiment of the present application.

The number of the first light-emitting devices 210 and the number of the second light-emitting devices 220 can be set in various correspondences. For example, within a group 200 of light-emitting devices, one or more second light-emitting devices 220 may be provided at circumference of one first light-emitting device 210, or one second light-emitting device 220 may be disposed surrounding one or more first light-emitting devices 210. As shown in FIG. 17, one second light-emitting device 220 is disposed surrounding one first light-emitting device 210. Alternatively, as shown in FIG. 18, one second light-emitting device 220 is disposed surrounding more than two first light-emitting devices 210, for example, one second light-emitting device 220 is disposed surrounding three first light-emitting devices 210, which are used to emit red light, green light and blue light, respectively.

In some embodiments of the present application, as shown in FIG. 17, the first light-emitting devices 210 and the second light-emitting devices 220 in the group 200 of light-emitting devices are disposed on a one-to-one basis, that is, one second light-emitting device 220 is disposed surrounding one first light-emitting device 210. For example, one second light-emitting device 220 is disposed surrounding one first light-emitting device 210 in a closed ring.

In the embodiments, the first light-emitting device 210 and the second light-emitting device 220 can emit light of the same color, which makes more convenient for preparation of the display panel. In addition, when the first light-emitting device 210 and the second light-emitting device 220 emit light of the same color, the first light-emitting device 210 and the second light-emitting device 220 can be fabricated in a same process, which can improve manufacturing efficiency of the first light-emitting device 210 and the second light-emitting device 220.

In some embodiments of the present application, please still refer to FIG. 10 to FIG. 13 and FIG. 19, each of the first light-emitting device 210 and the second light-emitting device 220 includes a buffer layer 500. Within a single group 200 of light-emitting devices, the buffer layer 500 of second light-emitting device 220 and the buffer layer 500 of the first light-emitting device 210 are continuously disposed.

Figure 20:
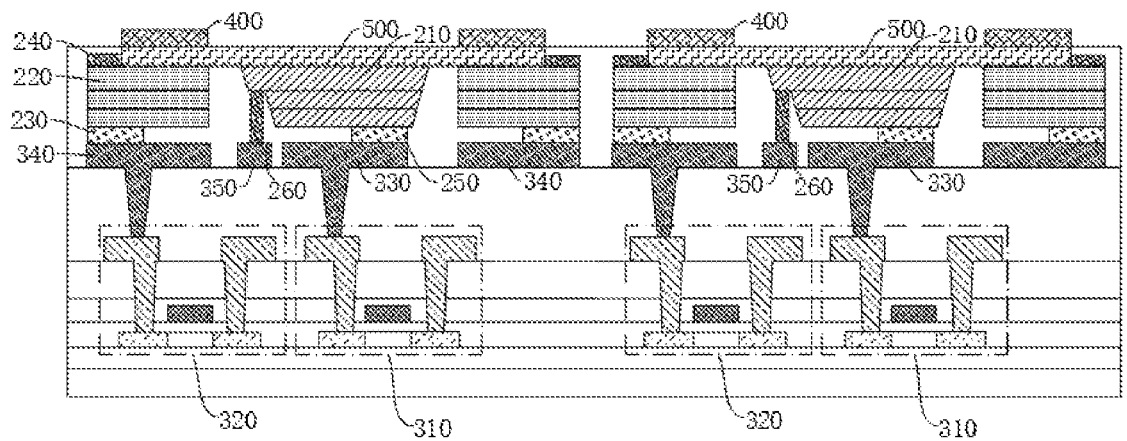
FIG. 20 is a cross-sectional view at C-C in FIG. 15.

During a manufacturing process of the first light-emitting device 210 and the second light-emitting device 220, a same buffer material layer may be fabricated with both the first light-emitting device 210 and the second light-emitting device, and then is cut to form the first light-emitting device 210 and the second light-emitting device 220, which can improve manufacturing efficiency of the first light-emitting device 210 and the second light-emitting device 220. In addition, the buffer layer 500 of the first light-emitting device 210 and the buffer layer 500 of the second light-emitting device 220 are continuous, so the first light-emitting device 210 and the second light-emitting device 220 may belong to a same transfer unit. During a pickup process of the first light-emitting device 210 and the second light-emitting device 220, the first light-emitting device 210 and the second light-emitting device 220 can be picked up at the same time, so the group 200 of light-emitting devices can be transferred at once, and thus transferring efficiency of first light-emitting device 210 and the second light-emitting device 220 can be improved In some embodiments of the present application, as shown in FIG. 20, the buffer layers 500 for different group 200 of light-emitting devices may be arranged spaced apart from each other. In the embodiments, the different groups 200 of light-emitting devices may be configured to emit light of different colors and transferred in different transferring steps.

Figure 19:
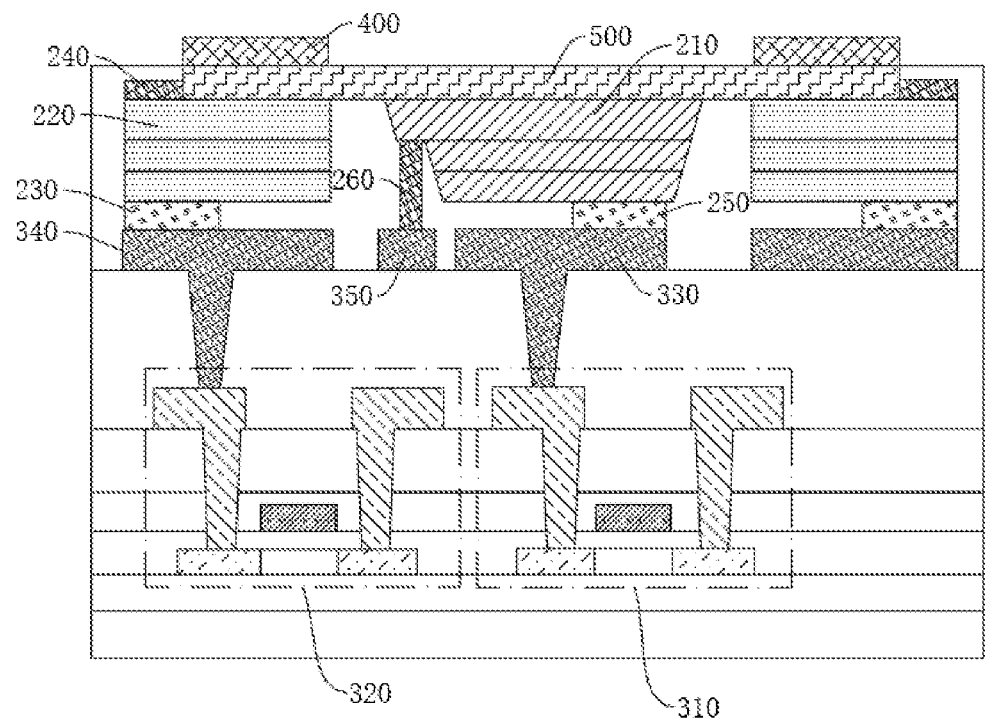
FIG. 19 is a cross-sectional view at B-B in FIG. 17.

As shown in FIG. 19 and FIG. 20, within a single group 200 of light-emitting devices, a maximum distance between the first light-emitting device 210 and the second light-emitting device 220 may be less than or equals to 5 μm. In some embodiments of the present application, for example, the first light-emitting device 210 and the second light-emitting device 220 may be formed on a same substrate, and then etched to form the first light-emitting device 210 and the second light-emitting device 220, so that the distance between the first light-emitting device 210 and the second light-emitting device 220 in the group of light-emitting devices is relatively smaller, which facilitates synchronous pickup of devise in the group 200 of light-emitting devices. The buffer layer 500 is retained in the process of forming the first light-emitting device 210 and the second light-emitting device 220 by etching, that is, the buffer layer 500 is not etched, which can ensure connection strength between the first light-emitting device 210 and the second light-emitting device 220 and ensure that the first light-emitting device 210 and the second light-emitting device 220 can be transferred to a driving backplane in a same transferring step.

Figure 21:
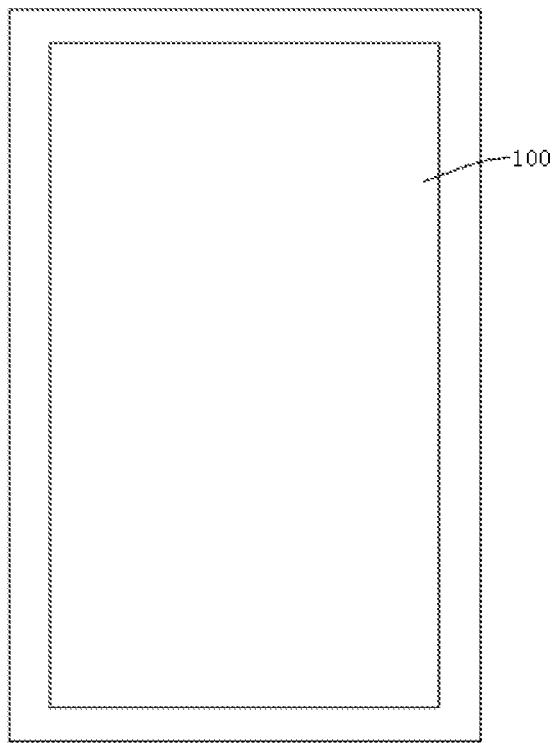
FIG. 21 is a schematic structural diagram of a display device according to an embodiment of the present application.

As shown in FIG. 21, in a second aspect of the embodiments of the present application, there is provided a display device 10. The display device 10 includes the display panel 100 according to any one of the above-mentioned embodiments of the first aspect. Since the display device 10 according to the embodiments in the second aspect of the present application includes the display panel 100 according to any embodiment in the first aspect, the display device 10 according to the embodiments in the second aspect of the present application can achieve the same technical effects as that of the display panel 100 according to any embodiment in the first aspect, which will not be repeated here.

The display device 10 in the embodiments of the present application includes, but is not limited to: a mobile phone, a personal digital assistant (Personal Digital Assistant, PDA for short), a tablet computer, an e-book, a television, an access control, an intelligent fixed phone, a console, etc. and any device having a display capability.

Figure 22:
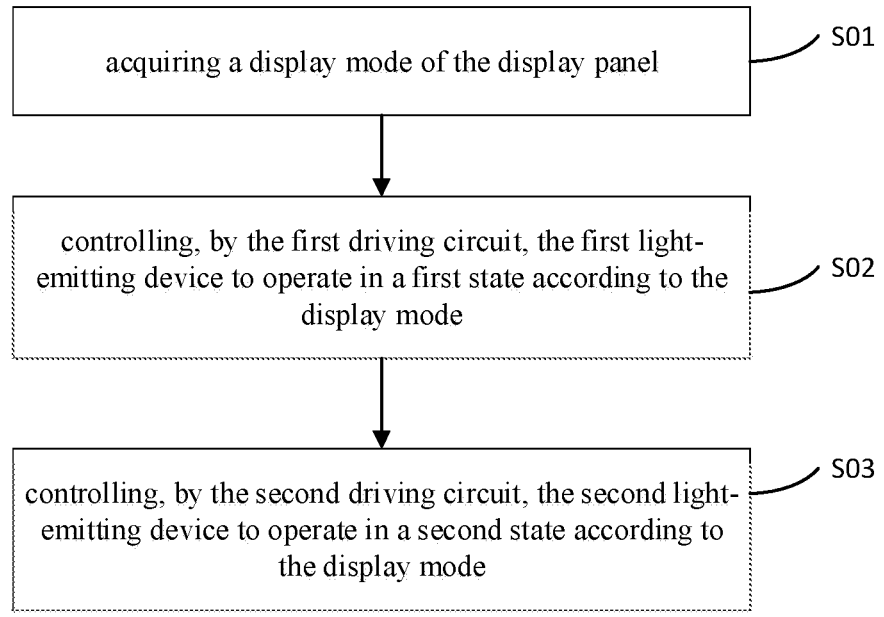
FIG. 22 is a schematic flow chart of a method for controlling a display panel according to an embodiment of the present application.

Please refer to FIG. 22, which is a schematic flowchart of a method for controlling a display panel according to an embodiment in a third aspect of the present application.

As shown in FIG. 22, according to the embodiments in the third aspect of the present application, there is provided a method for controlling a display panel, which is the display panel described above according to any of embodiments in the first aspect as shown in FIG. 1 to FIG. 20. The control method includes: Step S01: acquiring a display mode of the display panel; Step S02: controlling, by the first driving circuit, the first light-emitting device to operate in a first state according to the display mode; and Step S03: controlling, by the second driving circuit, the second light-emitting device to operate in a second state according to the display mode.

There are many ways to set the sequence of the step S02 and the step S03. For example, the step S02 may be performed before or after the step S03, and alternatively, the step S02 and step S03 may be performed simultaneously.

In the control method according to the embodiments of the present application, operation states of the first light-emitting device and the second light-emitting device can be controlled respectively by the first driving circuit and the second driving circuit according to the display mode of the display panel, that is, the first light-emitting device and the second light-emitting device may be in different operating modes independently from each other. As described above, the second light-emitting device is disposed surrounding the first light-emitting device and is configured to realize light outputting from sides of the display panel, while the first light-emitting device is configured to realize light outputting from the front of the display panel. By setting the operation states of the first light-emitting device and the second light-emitting device, either privacy protection or normal display can be achieved.

In some embodiments of the present application, when the display mode is a first mode, in Step S02: the first driving circuit controls the first light-emitting devices to operate in the first state to display first image information, and in Step S03: the second driving circuit controls the second light-emitting devices to operate in the second state to display second image information, wherein the second image information is different from the first image information.

The first mode is, for example, a privacy protection mode, the first image information is target image information, so the user observes the target image information at a front viewing angle, and the second image information is interference image information, so the user observes the interfering image information at a side viewing angle.

There are various ways for setting the second image information. For example, the second image information may be image information different from the first image information. In the privacy protection mode, the first light-emitting device and the second light-emitting device are configured to display different light-emitting information. At a side viewing angle, light emitted by the second light-emitting device interfere with light emitted by the first light-emitting device, making it difficult to clearly distinguish the light emitted by the first light-emitting device, while at a front viewing angle, since there is no interference from the second light-emitting device, the target image information can be displayed more clearly, so privacy protection at a side viewing angle can be realized.

In some other embodiments of the present application, the second image information may be dark state information for-turned-off of the second light-emitting device. At a side viewing angle, since the operation state of the second light-emitting device is a turned-off state, display information cannot be obtained, while at a front viewing angle, since there is no interference from the second light-emitting device, the target image information can be displayed more clearly, so privacy protection at a side viewing angle can be realized.

When the display mode is a second display mode, in Step S02: the first driving circuit controls the first light-emitting device to be in the first operation state to display first image information, and in Step S03: the second driving circuit controls the second light-emitting device to be in the second operation state to display second image information, wherein the first image information is the same as the second image information.

The second display mode is, for example, a normal display mode. When the display mode is the second display mode, the first light-emitting device and the second light-emitting device display the same image information, so no matter at a front viewing angle or at a side viewing angle, the user observes the same displayed information, and the display panel can achieve normal display.

While the application has been described with reference to the preferred embodiments, various modifications can be made and various elements can be replaced by their equivalents without departing from the scope of the application. In particular, as long as there is no structural conflict, each technical feature described in each embodiment can be combined in any manner. The present application is not limited to the specific embodiments disclosed herein, but includes all technical solutions falling within the scope of the claims.

What is claimed is:
1. A display panel, comprising:
   a substrate;
   a group of light-emitting devices located at a side of the substrate and comprising a first light-emitting device and a second light-emitting device that is disposed at least partially surrounding the first light-emitting device;
   a driving circuit comprising a first driving circuit for driving the first light-emitting device and a second driving circuit for driving the second light-emitting device,
   a shielding part located at a side of the group of light-emitting devices away from the substrate, wherein an orthographic projection of the shielding part on the substrate is at least partially overlapped with an orthographic projection of the second light-emitting device on the substrate.

2. The display panel according to claim 1, wherein the first light-emitting device comprises a first top surface located away from the substrate, a first bottom surface located facing the substrate and first side surfaces connecting the first top surface and the first bottom surface, wherein the first top surface functions as a light outputting surface, and an angle between the first side surface and the first bottom surface is an obtuse angle.

3. The display panel according to claim 2, wherein the display panel comprises a reflective layer covering at least a part of the first side surface.

4. The display panel according to claim 2, wherein at least a part of the first side surface functions as a light blocking surface.

5. The display panel according to claim 1, wherein the orthographic projection of the shielding part on the substrate is staggered with an orthographic projection of the first light-emitting device on the substrate.

6. The display panel according to claim 5, wherein the orthographic projection of the shielding part on the substrate is smaller than the orthographic projection of the second light-emitting device on the substrate, and wherein the second light-emitting device comprises a first region overlapping with the shielding part in a first direction and a second region not overlapping with the shielding part in the first direction, wherein the first region is located at a side of the second region close to the first light-emitting device; and
   wherein the first direction is perpendicular to a plane on which the display panel is located.

7. The display panel according to claim 6, wherein the display panel comprises a first electrode and a second electrode, one of the first electrode and the second electrode is connected to the second driving circuit for driving the second light-emitting device to emit light,
   wherein at least one of the first electrode and the second electrode also functions as the shielding part, or at least one of the first electrode and the second electrode is disposed side by side with the shielding part at a side of the second light-emitting device away from the substrate.

8. The display panel according to claim 7, wherein at least one of the first electrode and the second electrode is disposed side by side with the shielding part at a side of the second light-emitting device away from the substrate, and the first electrode and/or the second electrode is located in the second region.

9. The display panel according to claim 8, wherein the second light-emitting device comprises a second top surface located away from the substrate, the shielding part is contact and connected with the second top surface, and in a direction from the second light-emitting device to the first light-emitting device, a sum of a width of the first electrode and/or the second electrode and a width of the shielding part equals to a width of the second top surface.

10. The display panel according to claim 8, wherein one of the first electrode and the second electrode is disposed side by side with the shielding part on the second top surface, and the other one is located at a side of the second light-emitting device away from the second top surface.

11. The display panel according to claim 1, wherein the display panel comprises a third electrode and a fourth electrode, at least one of the third electrode and the fourth electrode is connected to the first driving circuit for driving the first light-emitting device to emit light, and the third electrode and the fourth electrode are located at a side of the first light-emitting device facing the substrate.

12. The display panel according to claim 1, wherein the shielding part comprises a light shielding material and/or reflective material, or
the shielding part is a distributed Bragg reflector for reflecting light emitted by the second light-emitting device.

13. The display panel according to claim 1, wherein the second light-emitting device comprises a second top surface located away from the substrate and second side surfaces connected to the second top surface and extended from the second top face towards the substrate, and at least a part of the second side surface functions as a light outputting surface.

14. The display panel according to claim 13, wherein an angle between the at least a part of the second side surface and a plane on which the substrate is located is 85 degree~95 degree.

15. The display panel according to claim 1, wherein the second light-emitting device is disposed surrounding the first light-emitting device in a closed ring.

16. The display panel according to claim 1, wherein one second light-emitting device is disposed surrounding one or more first light-emitting devices.

17. The display panel according to claim 1, wherein each of the first light-emitting device and the second light-emitting device comprises a buffer layer, and within a same group of light-emitting devices, the buffer layer of the first light-emitting device and the buffer layer of the second light-emitting device are disposed continuously with each other.

18. A display device, comprising a display panel, wherein the display panel comprises:
a substrate;
a group of light-emitting devices located at a side of the substrate and comprising a first light-emitting device and a second light-emitting device that is disposed at least partially surrounding the first light-emitting device;
a driving circuit comprising a first driving circuit for driving the first light-emitting device and a second driving circuit for driving the second light-emitting device,
a shielding part located at a side of the group of light-emitting devices away from the substrate, wherein an orthographic projection of the shielding part on the substrate is at least partially overlapped with an orthographic projection of the second light-emitting device on the substrate.

19. A method for controlling a display panel, the display panel comprising:
comprising:
a substrate;
a group of light-emitting devices located at a side of the substrate and comprising a first light-emitting device and a second light-emitting device that is disposed at least partially surrounding the first light-emitting device;
a driving circuit comprising a first driving circuit for driving the first light-emitting device and a second driving circuit for driving the second light-emitting device,
a shielding part located at a side of the group of light-emitting devices away from the substrate, wherein an orthographic projection of the shielding part on the substrate is at least partially overlapped with an orthographic projection of the second light-emitting device on the substrate, and
the method comprises:
acquiring a display mode of the display panel;
controlling, by the first driving circuit, the first light-emitting device to operate in a first state according to the display mode; and
controlling, by the second driving circuit, the second light-emitting device to operate in a second state according to the display mode.

20. The method according to claim 19, wherein the display mode is a first mode, and
the controlling, by the first driving circuit, the first light-emitting device to operate in the first state according to the display mode comprises: controlling, by the first driving circuit, the first light-emitting devices to operate in the first state to display first image information; and
the controlling, by the second driving circuit, the second light-emitting device to operate in the second state according to the display mode comprises: controlling, by the second driving circuit, the second light-emitting devices to operate in the second state to display second image information, wherein the second image information is different from the first image information.

\* \* \* \* \*